(12) United States Patent
Danno et al.

(10) Patent No.: US 9,982,365 B2
(45) Date of Patent: May 29, 2018

(54) METHOD FOR PRODUCING SIC SINGLE CRYSTAL

(71) Applicants: TOYOTA JIDOSHA KABUSHIKI KAISHA, Toyota-shi, Aichi-ken (JP); NIPPON STEEL & SUMITOMO METAL CORPORATION, Tokyo (JP)

(72) Inventors: Katsunori Danno, Susono (JP); Kazuhiko Kusunoki, Tokyo (JP); Kazuhito Kamei, Tokyo (JP)

(73) Assignees: TOYOTA JIDOSHA KABUSHIKI KAISHA, Toyota (JP); NIPPON STEEL & SUMITOMO METAL CORPORATION, Tokyo (JP)

( * ) Notice: Subject to any disclaimer, the term of this patent is extended or adjusted under 35 U.S.C. 154(b) by 146 days.

(21) Appl. No.: 14/541,740

(22) Filed: Nov. 14, 2014

(65) Prior Publication Data

US 2015/0136016 A1 May 21, 2015

(30) Foreign Application Priority Data

Nov. 21, 2013 (JP) .................................. 2013-241086

(51) Int. Cl.
*C30B 29/36* (2006.01)
*C30B 17/00* (2006.01)
(Continued)

(52) U.S. Cl.
CPC ............ *C30B 29/36* (2013.01); *C30B 11/003* (2013.01); *C30B 17/00* (2013.01); *C30B 19/04* (2013.01); *C30B 9/06* (2013.01)

(58) Field of Classification Search
CPC .......... C30B 29/36; C30B 19/04; C30B 17/00; C30B 19/02; C30B 9/06
See application file for complete search history.

(56) References Cited

U.S. PATENT DOCUMENTS

| 5,662,969 A * | 9/1997 | Ling ........................ C23C 2/006 |
| | | 118/405 |
| 6,447,602 B1 * | 9/2002 | Beswick ................. C30B 15/10 |
| | | 117/14 |

(Continued)

FOREIGN PATENT DOCUMENTS

CN 102471927 A 5/2012
JP A-2000-264790 9/2000
(Continued)

*Primary Examiner* — Matthew Song
(74) *Attorney, Agent, or Firm* — Oliff PLC

(57) ABSTRACT

Provided is a method for producing a SiC single crystal wherein generation of polycrystals can be inhibited even if the temperature of the Si—C solution is changed after seed touching. This is achieved by a method for producing a SiC single crystal wherein a SiC seed crystal substrate held on a seed crystal holding shaft is contacted with a Si—C solution having a temperature gradient in which the temperature decreases from the interior toward the surface, to grow a SiC single crystal, comprising the steps of: (A) bringing the temperature of the solution to a first temperature, (B) contacting the substrate held on the holding shaft with the solution, (C) bringing the temperature of the solution to a second temperature after the contacting the substrate with the solution, and (D) moving the substrate held on the holding shaft in the vertical direction according to the change in liquid surface height of the solution when the temperature of the solution is brought from the first temperature to the second temperature.

8 Claims, 6 Drawing Sheets

(51) Int. Cl.
*C30B 19/04* (2006.01)
*C30B 11/00* (2006.01)
*C30B 9/06* (2006.01)

(56) References Cited

U.S. PATENT DOCUMENTS

| | | | | |
|---|---|---|---|---|
| 2006/0292057 A1* | 12/2006 | Nakamura | ................ | C30B 9/00 423/446 |
| 2013/0042802 A1* | 2/2013 | Danno | .................... | C30B 15/14 117/60 |
| 2014/0007807 A1* | 1/2014 | Daikoku | ................ | C30B 29/36 117/13 |
| 2014/0299046 A1* | 10/2014 | Domoto | ................. | C30B 19/04 117/30 |

FOREIGN PATENT DOCUMENTS

| | | |
|---|---|---|
| JP | A-2011-251881 | 12/2011 |
| WO | WO 2011007458 A1 * | 1/2011 ............. C30B 15/14 |
| WO | WO 2012/127703 A1 | 9/2012 |
| WO | WO 2012127703 A1 * | 9/2012 ............. C30B 29/36 |
| WO | WO 2014/167844 A1 | 10/2014 |
| WO | 2014/189010 A1 | 11/2014 |

* cited by examiner

METHOD FOR PRODUCING SiC SINGLE CRYSTAL

TECHNICAL FIELD

The present invention relates to a method for producing a SiC single crystal by a solution process.

BACKGROUND ART

SiC single crystals are thermally and chemically very stable, superior in mechanical strength, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical growth processes for growing SiC single crystals that are known in the prior art include gas phase processes, the Acheson process, and solution processes. Among gas phase processes, for example, sublimation processes have drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is situated in a graphite crucible and C is dissolved from the graphite crucible into the molten liquid, and a SiC crystal layer is deposited and grown on a seed crystal substrate set in the low temperature section. Solution processes are most promising for reducing defects, since crystal growth is carried out in a state of near thermal equilibrium, compared to gas phase processes. Recently, therefore, methods for producing SiC single crystals by solution processes have been proposed.

There has been described a production method based on a solution process in which the temperature when seed touching is performed is different from the temperature during growth of the SiC single crystal (PTL 1). PTL 1 describes "meltback", which eliminates strain or oxide films that may be present on the surface layer of the seed crystal substrate on which the SiC single crystal is grown.

In addition, it has been proposed to carry out seed touching at low temperature, followed by temperature increase to the growth temperature, in order to prevent heat shock dislocation from occurring (PTL 2).

CITATION LIST

Patent Literature

[PTL 1] Japanese Unexamined Patent Publication No. 2000-264790

[PTL 2] Japanese Unexamined Patent Publication No. 2011-251881

SUMMARY OF THE INVENTION

Problems to be Solved by the Invention

However, when the temperature of the Si—C solution is changed after seed touching in this manner in a solution process, polycrystals have sometimes formed in the SiC grown crystal.

A demand therefore exists for a method for producing a SiC single crystal wherein generation of polycrystals can be inhibited even if the temperature of the Si—C solution is changed after seed touching.

Means for Solving the Problems

The invention is a method for producing a SiC single crystal wherein a SiC seed crystal substrate held on a seed crystal holding shaft is contacted with a Si—C solution having a temperature gradient in which the temperature decreases from the interior toward the surface, to grow a SiC single crystal, the method for producing a SiC single crystal comprising the steps of:

(A) bringing the temperature of the Si—C solution to a first temperature, (B) contacting the seed crystal substrate held on the seed crystal holding shaft with the Si—C solution, (C) bringing the temperature of the Si—C solution to a second temperature after the contacting the seed crystal substrate with the Si—C solution, and (D) moving the seed crystal substrate held on the seed crystal-holding shaft in the vertical direction according to the change in liquid surface height of the Si—C solution when the temperature of the Si—C solution is brought from the first temperature to the second temperature.

Effect of the Invention

According to the invention it is possible to grow a SiC single crystal without generation of polycrystals, even if the temperature of the Si—C solution is changed after seed touching.

DESCRIPTION OF EMBODIMENTS

Figure 1:
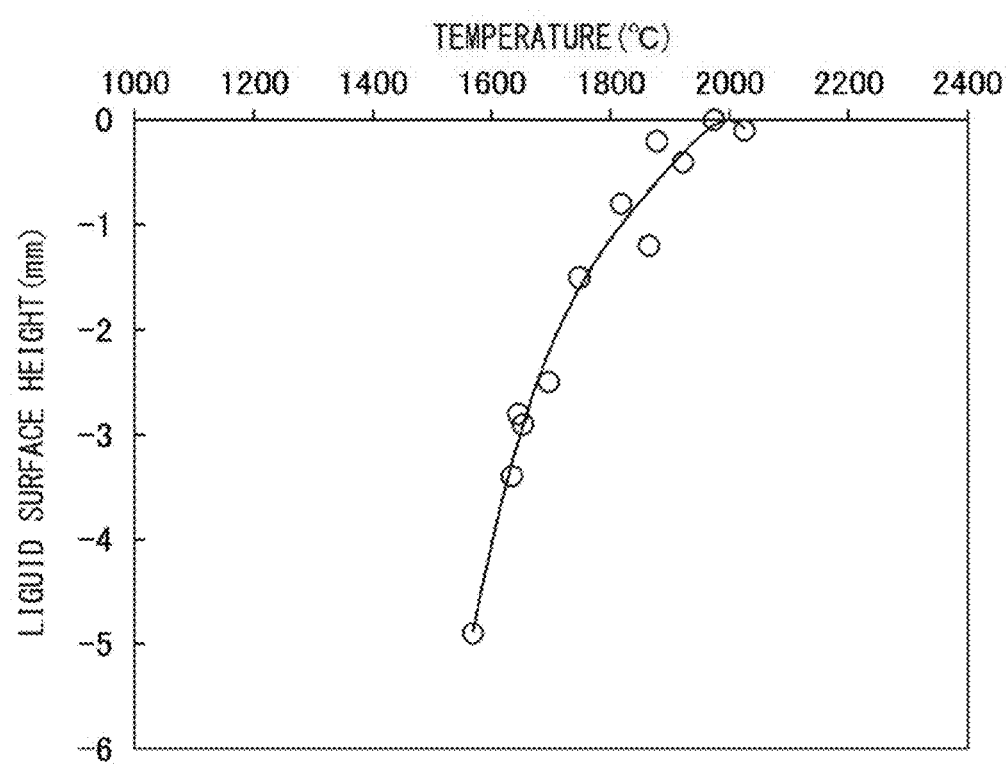
FIG. 1 is a graph showing the liquid surface height in relation to liquid surface temperature of a Si—C solution, when using the single crystal production apparatus shown in FIG. 2, based on zero as the liquid surface position of the Si—C solution when the liquid surface temperature of the Si—C solution is 1974° C.

Throughout the present specification, the indication "-1" in an expression, such as "(000-1) face", is used where normally a transverse line is placed over the numeral.

In methods for producing a SiC single crystal by a solution process according to the prior art, the temperature of the Si—C solution is changed after seed touching. By changing the temperature of the Si—C solution after seed touching, for example, meltback is carried out for removing strain or an oxide film on the surface of the seed crystal substrate. As used herein, "seed touching" means contacting the seed crystal substrate with the Si—C solution.

Also as used herein, "meltback" refers to dissolving the surface layer of the seed crystal substrate in the Si—C solution to remove it. The surface layer of a seed crystal substrate on which a SiC single crystal is to be grown generally has an affected layer, such as dislocation or the like, or a natural oxide film. Meltback can dissolve and remove the dislocations or defects present in the surface layer section of a seed crystal substrate, allowing growth of a SiC single crystal with few dislocations or defects.

Meltback can be performed by contacting the growth surface of the seed crystal substrate with the Si—C solution at low temperature (seed touching), and then increasing the temperature to a higher temperature.

Since the degree of saturation of the Si—C solution falls when the temperature of the Si—C solution is increased, the portion of the seed crystal substrate contacting with the Si—C solution dissolves in the Si—C solution, performing meltback.

Meltback can also be performed by contacting the growth surface of the seed crystal substrate with a Si—C solution having a temperature gradient in which the temperature increases from the interior toward the surface. Since the degree of saturation of the surface region of the Si—C solution falls by forming a temperature gradient in the Si—C solution in which the temperature increases from the interior toward the surface, the portion of the seed crystal substrate contacting with the Si—C solution dissolves in the Si—C solution, performing meltback.

Seed touching has also been performed at low temperature, followed by temperature increase to the growth temperature, in order to prevent heat shock dislocation from occurring.

However, when it is attempted to grow a SiC single crystal using a solution process wherein the Si—C solution temperature is changed after seed touching in this manner, polycrystals have sometimes formed in the SiC grown crystal.

The present inventors have conducted diligent research with the aim of inhibiting generation of polycrystals in the grown crystal when the temperature of the Si—C solution is changed after seed touching. As a result, they have found that the liquid surface height of the Si—C solution can be changed between the first temperature when seed touching of the seed crystal substrate to the Si—C solution is performed, and the subsequent second temperature, and thereby polycrystals may be generated in the grown crystal when the Si—C solution is contacted with the seed crystal holding shaft.

The invention is a method for producing a SiC single crystal by a solution process, the method comprising the steps of:

(A) bringing the temperature of a Si—C solution to a first temperature, (B) contacting a seed crystal substrate with the Si—C solution, (C) bringing the temperature of the Si—C solution to a second temperature after the contacting the seed crystal substrate with the Si—C solution, and (D) moving the seed crystal substrate held on the seed crystal holding shaft in the vertical direction according to the change in liquid surface height of the Si—C solution when the temperature of the Si—C solution is brought from the first temperature to the second temperature.

In the method of the invention, the first temperature and second temperature of the Si—C solution both refer to the surface temperature of the Si—C solution (also referred to as liquid surface temperature). When the temperature of the Si—C solution is simply mentioned without any particular explanation, it also refers to the surface temperature of the Si—C solution.

Figure 2:
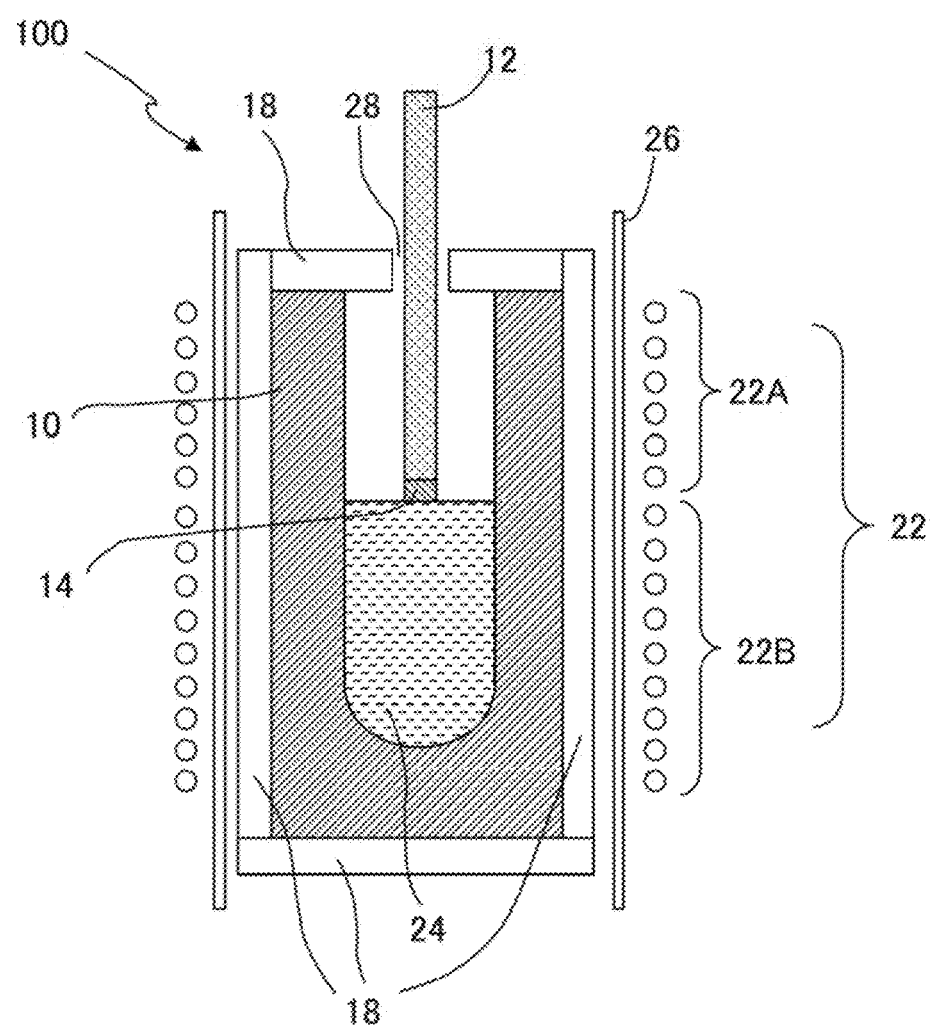
FIG. 2 is a cross-sectional schematic drawing representing an example of a single crystal production apparatus based on a solution process, which may be used for the invention.

FIG. 1 is a graph showing the liquid surface height in relation to liquid surface temperature of a Si—C solution, based on zero as the liquid surface position of the Si—C solution when the liquid surface temperature of the Si—C solution is 1974° C. The graph of FIG. 1 contains data obtained by using the single crystal production apparatus schematically illustrated in FIG. 2. FIG. 2 is a cross-sectional schematic drawing of an example of a single crystal production apparatus based on the solution process, which may be used for the invention, and this single crystal production apparatus comprises a high-frequency coil disposed surrounding a crucible as the heating apparatus.

From the graph of FIG. 1 it is seen that when, for example, seed touching is carried out with a Si—C solution temperature of 1700° C., and then the temperature of the Si—C solution is increased to 2000° C., the liquid surface height of the Si—C solution increases by 2.5 mm.

Therefore, the Si—C solution may wet the sides of the seed crystal substrate, and the Si—C solution may also exceed the seed crystal substrate to contact the seed crystal holding shaft, since the liquid surface height of the Si—C solution increases by, for example, 2.5 mm if the bottom face of the seed crystal substrate is contacted with the surface of the Si—C solution at 1700° C. and the temperature is then raised to 2000° C. while fixing the holding position of the seed crystal substrate. Contact of the Si—C solution with the seed crystal holding shaft in this manner can generate polycrystals in the grown crystal.

Figure 3:
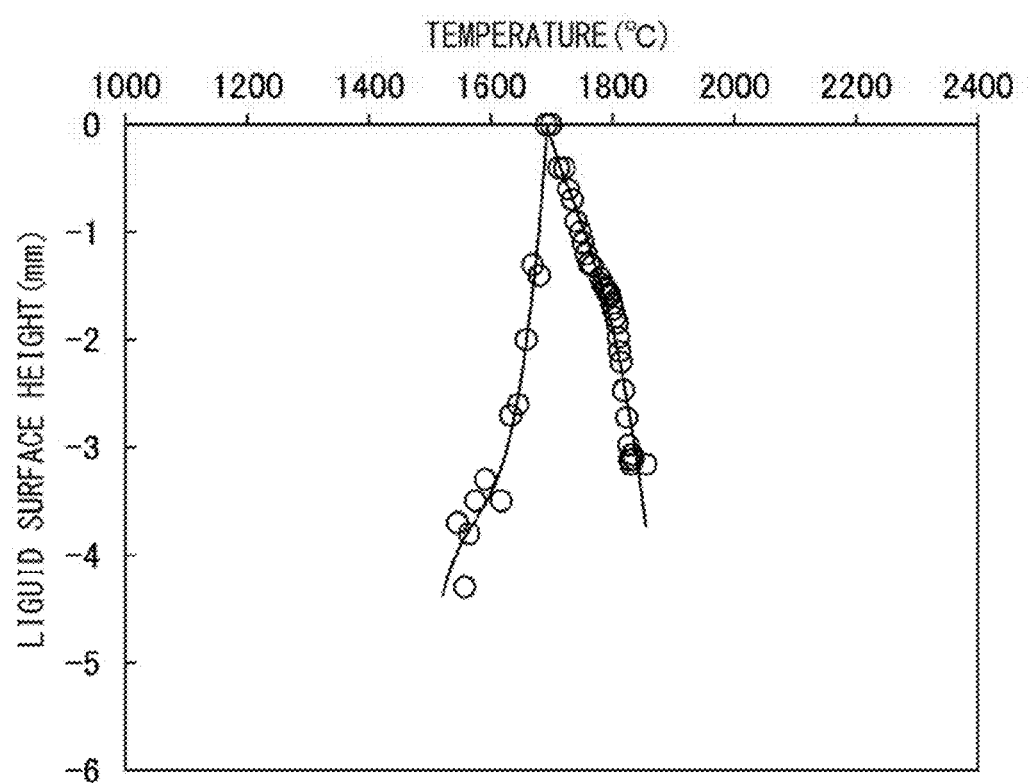
FIG. 3 is a graph showing the liquid surface height in relation to liquid surface temperature of a Si—C solution, when using the single crystal production apparatus shown in FIG. 4, based on zero as the liquid surface position of the Si—C solution when the liquid surface temperature of the Si—C solution is 1699° C.
Figure 4:
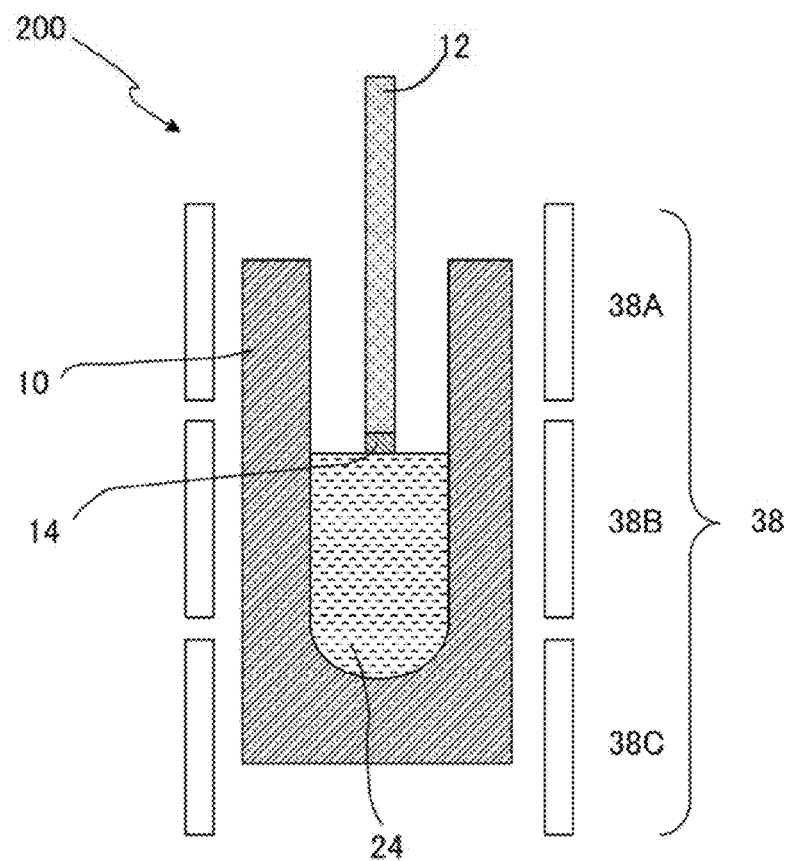
FIG. 4 is a cross-sectional schematic drawing representing an example of a single crystal production apparatus based on a solution process, which may be used for the invention.

FIG. 3 shows a graph of liquid surface height with respect to liquid surface temperature of the Si—C solution, when a different single crystal production apparatus schematically illustrated in FIG. 4 is used. FIG. 4 is a cross-sectional schematic drawing of an example of a single crystal production apparatus based on the solution process, which may be used for the invention, and this single crystal production apparatus comprises a graphite heater surrounding a crucible as the heating apparatus. The graph of FIG. 3 is based on zero as the liquid surface position when the liquid surface temperature of the Si—C solution is 1699° C.

From the graph of FIG. 3 it is seen that, for example, when seed touching is carried out with a Si—C solution temperature of 1600° C., and then the temperature of the Si—C solution is increased to 1850° C., the liquid surface height of the Si—C solution is substantially the same, but the liquid surface height of the Si—C solution increases by about 3 mm near 1700° C., during the temperature increase.

Thus, the Si—C solution may wet the sides of the seed crystal substrate, and may also exceed the seed crystal substrate to contact the seed crystal holding shaft, since the liquid surface height of the Si—C solution increases by, for example, about 3 mm near 1700° C. during the temperature increase if the bottom face of the seed crystal substrate is contacted with the surface of the Si—C solution at 1600° C. and the temperature is then raised to 1850° C. while fixing the holding position of the seed crystal substrate. Once the Si—C solution contacts with the seed crystal holding shaft, the Si—C solution and seed crystal holding shaft remain wetted even if the liquid surface position of the Si—C solution is subsequently lowered, thus tending to result in generation of polycrystals in the grown crystal.

It is thus seen that the liquid surface height of the Si—C solution changes by the temperature of the Si—C solution, and also that the tendency of the liquid surface height of the Si—C solution to change by the temperature of the Si—C solution varies depending on the single crystal production apparatus used. Furthermore, it has been found that, in order to prevent the Si—C solution from contacting the seed crystal holding shaft, it may be necessary to move the position of the seed crystal substrate in consideration of not only the liquid surface height of the Si—C solution at the first temperature at which seed touching is performed and the liquid surface height of the Si—C solution at the subsequent second temperature, but also change in liquid surface height between the first temperature and second temperature.

While not being constrained by theory, it is believed that the liquid surface height of the Si—C solution can change primarily depending on the temperature of the Si—C solution, and depending on the high-frequency output when high-frequency heating is carried out. It is believed that when the temperature increases, the liquid surface height of the Si—C solution changes due to expansion of the crucible, seed crystal holding shaft, Si—C solution and the like, and when high-frequency heating is carried out, Lorentz force acts on the Si—C solution, so that the liquid surface of the Si—C solution is elevated by pinching force.

Therefore, it is effective to determine in advance the change in liquid surface height of the Si—C solution between the first temperature of the Si—C solution when seed touching is performed and the subsequent second temperature, for the single crystal production apparatus that is used, and to move the position of the seed crystal substrate in the vertical direction according to the change in liquid surface height of the Si—C solution that has been determined in advance.

Placement of the seed crystal substrate in the single crystal production apparatus may be performed by holding the top face of the seed crystal substrate on the seed crystal holding shaft. The position of the seed crystal substrate can therefore be changed by moving the seed crystal holding shaft in the vertical direction. A carbon adhesive may be used for holding of the seed crystal substrate on the seed crystal holding shaft.

Contact of the seed crystal substrate with the Si—C solution may be performed by lowering the seed crystal holding shaft holding the seed crystal substrate toward the Si—C solution surface, and contacting it with the Si—C solution while the bottom face of the seed crystal substrate is parallel to the Si—C solution surface. Growth of the SiC single crystal can be performed by holding the seed crystal substrate at a prescribed position relative to the Si—C solution surface.

Measurement of the liquid surface height of the Si—C solution may be performed, for example, by applying a voltage between the Si—C solution and the seed crystal holding shaft, and observing the change in current value when the seed crystal holding shaft contacts the Si—C solution. No seed crystal substrate is necessary for the measurement. When a conductive seed crystal holding shaft is used and a voltage is applied between the Si—C solution and the seed crystal holding shaft, the conductivity of the Si—C solution allows a current to flow when the seed crystal holding shaft contacts the Si—C solution. Therefore, the liquid surface height of the Si—C solution can be measured from the position of the seed crystal holding shaft at that time. When the liquid surface height of the Si—C solution is measured, another conducting material may be used instead of the seed crystal holding shaft.

The holding position of the seed crystal substrate may be such that the position of the bottom face of the seed crystal substrate matches the Si—C solution surface, is below the Si—C solution surface, or is above the Si—C solution surface, at the first temperature, the second temperature, and the temperature between the first temperature and second temperature. The holding position of the seed crystal substrate with respect to the Si—C solution surface may be changed at the first temperature, the second temperature, and the temperature between the first temperature and second temperature. When the SiC single crystal is grown at the second temperature, the position of the bottom face of the seed crystal substrate is preferably a position above the Si—C solution surface so that a meniscus is formed, at least at the second temperature. When a SiC single crystal is grown at the second temperature, more preferably the position of the bottom face of the seed crystal substrate is a position above the Si—C solution surface, so that a meniscus is formed, at the first temperature, the second temperature, and a temperature between the first temperature and second temperature. By forming a meniscus in this manner, it will be easier to prevent contact of the Si—C solution with the seed crystal holding shaft. When a SiC single crystal is grown with formation of a meniscus at the second temperature, it will be easier to grow a clean SiC single crystal as described below.

Figure 5:
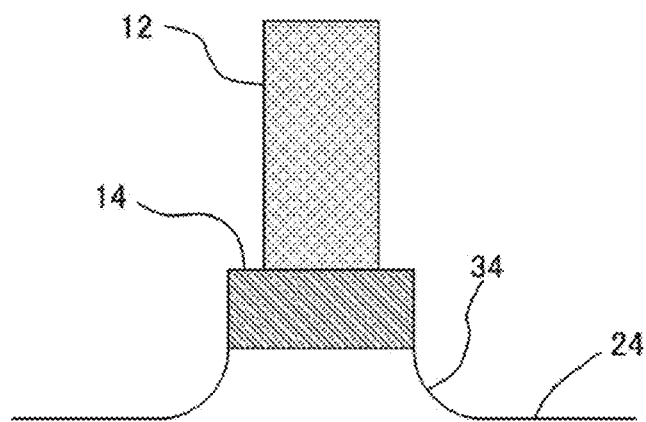
FIG. 5 is a cross-sectional schematic drawing of a meniscus formed between a seed crystal substrate and a Si—C solution.

FIG. 5 is a cross-sectional schematic drawing of the meniscus 34 formed between a seed crystal substrate 14 and a Si—C solution 24. As used herein, "meniscus" refers to a concave curved surface formed on the surface of the Si—C solution by surface tension upon wetting of the seed crystal substrate, as shown in FIG. 5. By performing crystal growth with formation of a meniscus, it will be easier to inhibit generation of polycrystals and it will be easier to grow a SiC single crystal composed of a single crystal with a clean outer periphery. A meniscus can be formed by, for example, contacting the seed crystal substrate with the Si—C solution, and then raising and holding the seed crystal substrate at a position where the bottom face of the seed crystal substrate is higher than the liquid surface of the Si—C solution. When a meniscus is formed, the position of the bottom face of the seed crystal substrate is placed at a position preferably 0.5 to 5 mm and more preferably 1 to 4 mm above the Si—C solution surface.

Since the meniscus portion formed on the outer periphery of the growth interface is at a lower temperature due to radiation heat loss, formation of the meniscus can create a temperature gradient in which the temperature of the Si—C solution is lower at the outer periphery than at the center section directly below the interface with the crystal growth plane. This can increase the degree of supersaturation of the Si—C solution at the outer periphery of the growth interface, so that it is greater than the degree of supersaturation of the Si—C solution at the center section of the growth interface.

By increasing the degree of supersaturation of the Si—C solution at the outer periphery of the growth interface to be greater than the degree of supersaturation of the Si—C solution at the center section of the growth interface, a gradient is formed for the degree of supersaturation in the horizontal direction within the Si—C solution directly below the crystal growth interface, and a SiC crystal can be grown having a concave crystal growth plane. This allows crystal growth so that the crystal growth plane of the SiC single crystal is not a just plane, and can prevent generation of inclusions.

When the seed crystal substrate is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position.

The position of the bottom face of the seed crystal substrate may match the Si—C solution surface or be lower than the Si—C solution surface. However, in order to prevent generation of polycrystals, the Si—C solution is kept from contacting with the seed crystal holding shaft.

In the method of the invention, the position of the seed crystal substrate is moved in the vertical direction according to the change in liquid surface height of the Si—C solution as determined in advance, so that the Si—C solution does not contact the seed crystal holding shaft, and preferably the position of the seed crystal substrate is moved in the vertical direction so that the position of the bottom face of the seed crystal substrate is at a fixed height from the liquid surface of the Si—C solution. In the method of the invention, when only the bottom face of the seed crystal substrate wets the Si—C solution, the position of the seed crystal substrate is moved in the vertical direction so that the Si—C solution does not wet the sides of the seed crystal substrate.

In the method of the invention, either step (A) or step (B) may be carried out first, or they may be carried out simultaneously.

After the temperature of the Si—C solution is raised to the first temperature in step (A), seed touching of the seed crystal substrate to the Si—C solution may be carried out in step (B). When seed touching of the seed crystal substrate to the Si—C solution at the first temperature is carried out in step (B), seed touching may be carried out after holding the Si—C solution at the first temperature for a predetermined time, or at the start of the holding of the Si—C solution at the first temperature, or seed touching may be carried out at the first temperature while increasing the temperature of the Si—C solution and temperature increase may be continued without holding the temperature, or seed touching may be carried out at the first temperature while lowering the temperature of the Si—C solution and the temperature lowering may be continued without holding the temperature.

Seed touching of the seed crystal substrate to the Si—C solution may be performed in step (B) at a lower temperature than the first temperature, for example, at about 1400° C. at which the starting material of the Si—C solution melts, and the temperature of the Si—C solution is subsequently raised to the first temperature while adjusting the position of the seed crystal substrate if necessary so that the Si—C solution does not contact with the seed crystal holding shaft. This embodiment includes contacting the seed crystal substrate with the starting material of the Si—C solution at a lower temperature than the temperature at which the starting material of the Si—C solution melts, and raising the temperature of the starting material to melt it so as to perform seed touching of the seed crystal substrate to the Si—C solution.

Alternatively, seed touching of the seed crystal substrate to the Si—C solution may be performed in step (B) at a higher temperature than the first temperature, for example, at 2500° C., and the temperature of the Si—C solution subsequently lowered to the first temperature while adjusting the position of the seed crystal substrate.

The position of the seed crystal substrate is moved in the vertical direction so that the Si—C solution does not contact with the seed crystal holding shaft while the temperature is being raised or lowered to the first temperature, and preferably the position of the seed crystal substrate is moved in the vertical direction so that the position of the bottom face of the seed crystal substrate is at a prescribed height with respect to the position of the surface of the Si—C solution. When only the bottom face of the seed crystal substrate wets the Si—C solution, the position of the seed crystal substrate is moved in the vertical direction so that the Si—C solution does not wet the sides of the seed crystal substrate.

In the method of the invention, either step (C) or step (D) may be carried out first, or they may be carried out simultaneously.

The position of the seed crystal substrate may be changed in step (D) while raising or lowering the temperature of the Si—C solution to the second temperature in step (C), either simultaneously or after a short delay. In that case, the position of the seed crystal substrate is moved in the vertical direction so that the Si—C solution does not contact with the seed crystal holding shaft, and preferably the position of the seed crystal substrate is moved in the vertical direction so that the position of the bottom face of the seed crystal substrate is at a prescribed height with respect to the position of the surface of the Si—C solution. When only the bottom face of the seed crystal substrate wets the Si—C solution, the position of the seed crystal substrate is moved in the vertical direction so that the Si—C solution does not wet the sides of the seed crystal substrate.

So long as the seed crystal substrate and Si—C solution are kept in a wetted state and the Si—C solution does not contact with the seed crystal holding shaft, the position of the seed crystal substrate may be changed in step (D) and then the temperature of the Si—C solution may be raised or lowered to the second temperature in step (C).

The method of the invention preferably includes meltback of the seed crystal substrate. When meltback of the seed crystal substrate is carried out in the method of the invention, the method may be one in which the growth surface of the seed crystal substrate is contacted with the Si—C solution at a low temperature, and meltback is performed by raising the temperature to a higher temperature. Since the degree of saturation of the Si—C solution falls when the temperature of the Si—C solution is increased, the portion of the seed crystal substrate contacting with the Si—C solution dissolves in the Si—C solution, allowing meltback to be performed.

In that case, the first temperature of the Si—C solution when seed touching is performed is lower than the second temperature of the Si—C solution during crystal growth, wherein the temperature difference between the first temperature and second temperature is preferably at least 50° C. and more preferably at least 100° C. It is possible to more reliably carry out meltback by ensuring such a temperature difference between the first temperature and second temperature. The temperature-elevating rate from the first temperature to the second temperature is preferably from 1° C./min to 20° C./min and more preferably from 3° C./rain to 15° C./min. The temperature difference and temperature-elevating rate from the first temperature to the second temperature may also be changed according to the thickness of the crystal subjected to meltback.

When meltback of the seed crystal substrate is carried out in the method of the invention, the method may be a different method in which there is formed in the Si—C solution a temperature gradient in which the temperature increases from the interior of the Si—C solution toward the surface of the solution, i.e. a temperature gradient in the reverse direction from that used for growth of the SiC single crystal. It is possible to form a temperature gradient in this reverse direction by controlling output from the high-frequency coil.

When a temperature gradient in the reverse direction is formed for meltback, preferably seed touching is carried out with a Si—C solution having a first temperature and a temperature gradient in the reverse direction to perform meltback, and then a temperature gradient in which the temperature falls from the interior of the Si—C solution toward the surface of the solution, is formed, while lowering the temperature to the second temperature, or at the second temperature that is lower than the first temperature, to grow the SiC single crystal.

When a temperature gradient in the reverse direction is formed for meltback, the second temperature may be higher than the first temperature, or the second temperature may be the same as the first temperature.

Since the liquid surface height of the Si—C solution may change when the temperature gradient of the Si—C solution is changed, the change in liquid surface height is measured beforehand when the temperature gradient of the Si—C solution is changed, even if the second temperature is the same as the first temperature, similar to when the first temperature and the second temperature are different.

The thickness to be dissolved by meltback depends on the thickness of the layer containing the dislocations or defects, but it is generally preferred to be about 1 µm to 1 mm or about 1 µm to 100 µm for sufficient removal of the layer containing dislocations or defects that may be generated during growth.

In the invention, the first temperature may be higher than the second temperature. For example, the Si—C solution may be heated to a higher temperature than the crystal growth temperature in order to facilitate dissolution of carbon into the Si—C solution, followed by seed touching, and the temperature may be then decreased to the second temperature.

In the invention, the SiC single crystal may be grown at the second temperature, or the SiC single crystal may be grown after further changing the temperature of the Si—C solution from the second temperature to a third temperature. For example, seed touching may be carried out at the first temperature, the temperature may be raised to a higher second temperature for meltback, and then the temperature may be lowered to a third temperature that is similar to the first temperature, and growth of the SiC single crystal may be carried out at the third temperature.

In the method of the invention, a Si—C solution is a solution in which C is dissolved, where the solvent is a molten liquid of Si or Si/X (X is one or more metals other than Si). X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A Si—C solution wherein the solvent is a molten liquid with an atomic composition percentage of Si/Cr/X=30-80/20-60/0-10, has low variation in C dissolution and is therefore more preferred. For example, Cr, Ni and the like may be loaded into the crucible in addition to Si, to form a Si—Cr solution, Si—Cr—Ni solution or the like.

The lower limit for the surface temperature of the Si—C solution is preferably 1800° C. or higher and the upper limit is preferably 2200° C., as the dissolution of C in the Si—C solution can be increased within this temperature range. When an n-type SiC single crystal is grown, the lower limit for the surface temperature of the Si—C solution is preferably 2000° C. or higher from the viewpoint of allowing the amount of nitrogen dissolution in the Si—C solution to be increased.

Measurement of the surface temperature and the internal solution temperature of the Si—C solution can be performed by using a thermocouple, radiation thermometer or the like. From the viewpoint of high temperature measurement and preventing inclusion of impurities, the thermocouple is preferably a thermocouple comprising a tungsten-rhenium wire covered with zirconia or magnesia glass, placed inside a graphite protection tube.

The SiC single crystal production apparatus 100 shown in FIG. 2 will now be explained as an example of a SiC single crystal production apparatus which may be used for the method of the invention. The SiC single crystal production apparatus 100 comprises a crucible 10 that receives a Si—C solution 24 having C dissolved in a molten liquid of Si or Si/X, and a high-frequency coil 22 as a heating apparatus surrounding the crucible 10, wherein a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14 as the origin. The crucible 10 and the graphite shaft 12 are preferably rotated with the axis of the seed crystal holding shaft 12 as the center.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

The seed crystal holding shaft 12 is a shaft that holds the seed crystal substrate on its end face, and it is preferably a conductive shaft, and more preferably a graphite shaft. The seed crystal holding shaft 12 may have any desired shape, such as cylindrical or columnar, and there may be used a graphite shaft having the same end face shape as the top face of the seed crystal substrate.

For thermal insulation, the outer periphery of the crucible 10 may be covered with a heat-insulating material 18. These may be housed together inside a quartz tube 26. A high-frequency coil 22 is disposed as a heating apparatus around the heat-insulating material 18. The high-frequency coil 22 may be configured, for example, with a multi-level configuration comprising an upper level coil 22A and a lower level coil 22B, which are each independently controllable.

Since the temperatures of the crucible 10, heat-insulating material 18, quartz tube 26 and high-frequency coil 22 become high, they may be situated inside a water-cooling chamber. The water-cooling chamber may be provided with a gas inlet and a gas exhaust vent to allow atmospheric modification in the device.

The crucible 10 comprises an opening 28 at the top through which the seed crystal holding shaft 12 passes, and it is possible to vary the amount of radiation heat loss from the surface of the Si—C solution 24 by adjusting the gap (spacing) between the crucible 10 and the seed crystal holding shaft 12 at the opening 28. Although it is usually necessary to keep the interior of the crucible 10 at high temperature, setting a large gap between the crucible 10 and the seed crystal holding shaft 12 at the opening 28 can increase radiation heat loss from the surface of the Si—C solution 24, while setting a small gap between the crucible 10 and the seed crystal holding shaft 12 at the opening 28 can reduce radiation heat loss from the surface of the Si—C solution 24. The gap (spacing) between the crucible 10 and the seed crystal holding shaft 12 at the opening 28 is preferably about 2 to 10 mm on the side. When a meniscus is formed, radiation heat loss can take place from the meniscus portion as well.

The temperature of the Si—C solution 24 generally has a temperature distribution in which the temperature of the surface of the Si—C solution 24 is lower than the interior due to radiation and the like. Further, a prescribed temperature gradient can be formed in the Si—C solution 24 in the direction perpendicular to the surface of the Si—C solution 24 so that an upper portion of the solution in which the seed crystal substrate 14 is immersed is at low temperature and a lower portion of the solution is at high temperature, by adjusting the number of coils and spacing of the high-frequency coil 22, the positional relationship of the high-frequency coil 22 and the crucible 10 in the height direction, and the output of the high-frequency coil 22. For example, the output of the upper level coil 22A may be smaller than the output of the lower level coil 22B, to form a prescribed temperature gradient in the Si—C solution 24 in which an upper portion of the solution is at low temperature and a lower portion of the solution is at high temperature.

The SiC single crystal production apparatus to be used for the method of the invention is not limited to the one illustrated in FIG. 2, and for example, the SiC single crystal production apparatus 200 illustrated in FIG. 4 may be used. The SiC single crystal production apparatus 200 comprises a graphite heater 38 as a heating apparatus. The graphite heater 38 may have a multi-level configuration, for example, having an upper level heater 38A, a mid-level heater 38B, a lower level heater 38C and the like, which are each independently controllable. A heat-insulating material (not shown) is disposed surrounding the crucible 10 and the graphite heater 38. As a different configuration, the SiC single crystal production apparatus 200 may have a configuration similar to the SiC single crystal production apparatus 100 shown in FIG. 2.

Throughout the present specification, the temperature gradient in the surface region of the Si—C solution is the temperature gradient in the direction perpendicular to the surface of the Si—C solution, which is a temperature gradient where the temperature falls from the interior of the Si—C solution toward the surface of the solution. The temperature gradient can be calculated as the average value obtained by pre-measuring the temperature A on the surface of the Si—C solution which is the low-temperature side, and the temperature B which is the high-temperature side at a prescribed depth from the surface of the Si—C solution to the solution side in the direction perpendicular to the surface of the Si—C solution, by using a thermocouple before contacting the seed crystal substrate with the Si—C solution, and dividing the temperature difference by the distance between the positions at which the temperature A and the temperature B were measured. For example, the temperature gradient between the surface of the Si—C solution and the position at depth D cm from the surface of the Si—C solution to the solution side in the direction perpendicular to the surface of the Si—C solution, can be calculated by the following formula:

$$\text{temperature gradient (° C./cm)} = (B-A)/D$$

which is the difference between the surface temperature A of the Si—C solution and the temperature B at a position at depth D cm from the surface of the Si—C solution to the solution side in the direction perpendicular to the surface of the Si—C solution, divided by D cm.

The range in which the temperature gradient is controlled is preferably to a depth of 1 cm and more preferably 0.3 cm from the surface of the Si—C solution. For example, when the temperature gradient is controlled to a depth of 1 cm from the surface of the Si—C solution, the temperature gradient (° C./cm) in the formula is the value obtained when the difference between the surface temperature A of the Si—C solution and the temperature B at a position at a depth of 1 cm from the surface of the Si—C solution to the solution side in the direction perpendicular to the surface of the Si—C solution, is divided by 1 cm. The temperature gradient is preferably no greater than 50° C./cm and more preferably no greater than 40° C./cm within this depth range.

When the range of control of the temperature gradient is too shallow, the range in which the temperature gradient is controlled will be shallow and the range in which the degree of supersaturation of C is controlled will also be shallow, sometimes causing growth of the SiC single crystal to be unstable. If the range of control of the temperature gradient is too deep, the range in which the degree of supersaturation of C is controlled will also be deep, which is effective for stable growth of the SiC single crystal, but in actuality the depth contributing to single crystal growth is very close to the surface of the Si—C solution and it is sufficient to control the temperature gradient up to a depth of several mm from the surface. Consequently, in order to perform stable SiC single crystal growth and temperature gradient control, it is preferred to control the temperature gradient within the depth range specified above.

The C dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the heating apparatus 22, heat radiation from the surface of the Si—C solution 24 and heat loss through the seed crystal holding shaft 12. When the C dissolved into the solution interior that is at high temperature and has high solubility reaches the region near the seed crystal substrate that is at low temperature and has low solubility, a supersaturated state appears and a SiC single crystal is grown on the seed crystal substrate by virtue of supersaturation as a driving force.

In the method of the invention, a SiC single crystal having quality commonly used for production of SiC single crystals may be used as the seed crystal substrate. For example, a SiC single crystal commonly formed by a sublimation process may be used as the seed crystal substrate.

The seed crystal substrate to be used in the method of the invention may have any desired shape, such as laminar, discoid, cylindrical, columnar, truncated conic or truncated pyramidal.

For example, the {0001} face of a seed crystal substrate having such a shape may be used as the bottom face of the seed crystal contacting with the Si—C solution surface, and the top face on the opposite side may be used as the face held on the seed crystal holding shaft.

EXAMPLES

Example 1

(Preparation Step)

In this example, a single crystal production apparatus 100, such as shown in FIG. 2, was used. The single crystal production apparatus 100 comprises a high-frequency heater 22. In a graphite crucible 10 housing a Si—C solution 24 there were charged Si/Cr/Ni in an atomic compositional ratio of 55:40:5, as a molten liquid starting material. The air in the single crystal production apparatus was exchanged with argon. A high-frequency coil 22 situated around the periphery of the graphite crucible 10 was electrified to melt the starting material in the graphite crucible 10 by heating, thereby forming a Si/Cr/Ni alloy molten liquid. A sufficient amount of C was then dissolved into the Si/Cr/Ni alloy molten liquid from the graphite crucible 10 to form a Si—C solution 24.

The outputs of the upper level coil 22A and lower level coil 22B were adjusted to heat the graphite crucible 10, forming a temperature gradient in which the temperature decreased from the interior of the Si—C solution 24 toward the surface of the solution. Formation of the prescribed temperature gradient was confirmed by using a vertically movable thermocouple to measure the temperature of the Si—C solution 24. The outputs of the high-frequency coils 22A and 22B were controlled to adjust the temperature at the surface of the Si—C solution 24 to 1569° C. With the surface of the Si—C solution 24 as the low-temperature side, the temperature difference was 25° C. between the temperature at the surface of the Si—C solution 24 and the temperature at a depth of 1 cm in the vertical direction from the surface of the Si—C solution 24 toward the interior of the solution.

Next, by controlling the outputs of the high-frequency coils 22A and 22B, the temperature at the surface of the Si—C solution 24 was raised to 2025° C. while maintaining the temperature gradient, and the liquid surface position of the Si—C solution between 1569° C. and 2025° C. was measured. The measurement results are shown in FIG. 1. The graph in FIG. 1 shows the liquid surface height of the Si—C solution between 1569° C. and 2025° C., with respect to zero as the liquid surface height of the Si—C solution at 1974° C. Based on the graph of FIG. 1, it is seen that when the temperature of the Si—C solution is increased from 1569° C. to 1974° C., the liquid surface height of the Si—C solution rises by 4.9 mm, while the liquid surface height of the Si—C solution at 2025° C. is 0.1 mm lower but about the same as at 1974° C. Furthermore, the graph of FIG. 1 shows that, for example, when the temperature of the Si—C solution is increased from 1700° C. to 2000° C., the liquid surface height of the Si—C solution rises by 2.5 mm.

A cylindrical graphite seed crystal holding shaft 12 was prepared having a diameter of 12 mm and a length of 200 mm, and an end face with the same shape as the top face of the seed crystal substrate. There was prepared a truncated conic 4H—SiC single crystal with a (000-1) just face, having a thickness of 0.5 mm, a bottom face diameter of 12 mm and a top face diameter of 10 mm, formed by a sublimation process, for use as a seed crystal substrate 14.

The top face of the seed crystal substrate 14 was bonded to about the center section of the end face of the seed crystal holding shaft 12 by using a graphite adhesive, with the bottom face of the seed crystal substrate 14 as the (000-1) face.

The seed crystal holding shaft 12 and seed crystal substrate 14 were situated so that the seed crystal holding shaft 12 passed through a circular opening 28 with a diameter of 30 mm, opened at the top of the crucible 10. The gap between the crucible 10 and the seed crystal holding shaft 12 at the opening 28 was 9 mm on the side.

(Crystal Growth Step)

In the same manner as the preparation step described above, the single crystal production apparatus 100 shown in FIG. 2 was used to form a Si—C solution 24, wherein the surface temperature was 1700° C. and the temperature gradient in which the temperature fell from the interior toward the surface was 25° C./cm.

The seed crystal holding shaft 12 holding the seed crystal substrate 14 was lowered, the seed crystal substrate 14 was contacted with the Si—C solution 24 so that the bottom face of the seed crystal substrate 14 matched the surface location of the Si—C solution 24, and only the bottom face of the seed crystal substrate 14 was wetted with the Si—C solution 24. The seed crystal substrate 14 was then raised so that the bottom face of the seed crystal substrate 14 was positioned 4.0 mm above the liquid surface of the Si—C solution 24, forming a meniscus in the Si—C solution 24.

The temperature of the surface of the Si—C solution 24 was then raised from 1700° C. to 2000° C. over 30 minutes for meltback, with a temperature gradient falling from the interior toward the surface at 25° C./cm, and the temperature and the temperature gradient were maintained for 5 hours to grow a SiC crystal.

Figure 6:
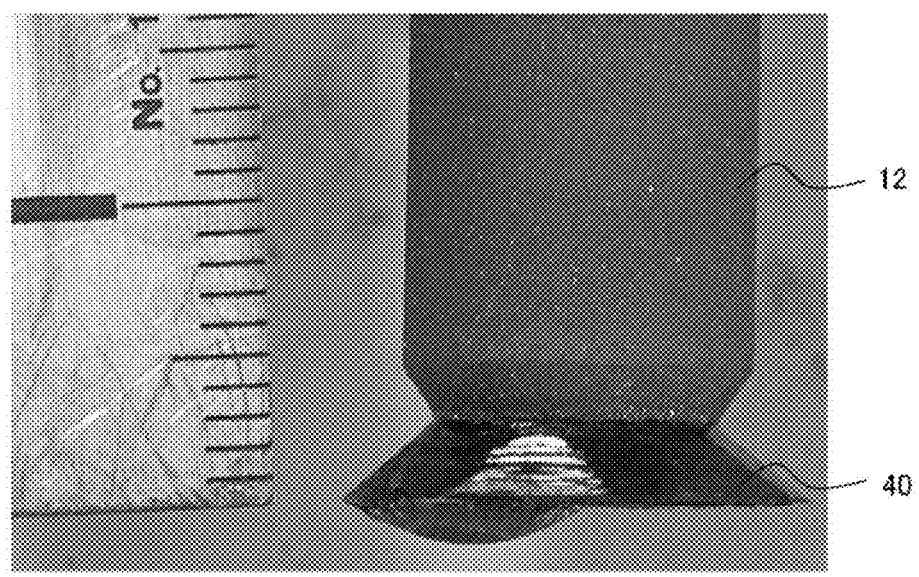
FIG. 6 is an external photograph of a SiC single crystal grown from a seed crystal substrate in the example, as viewed from the side.
Figure 7:
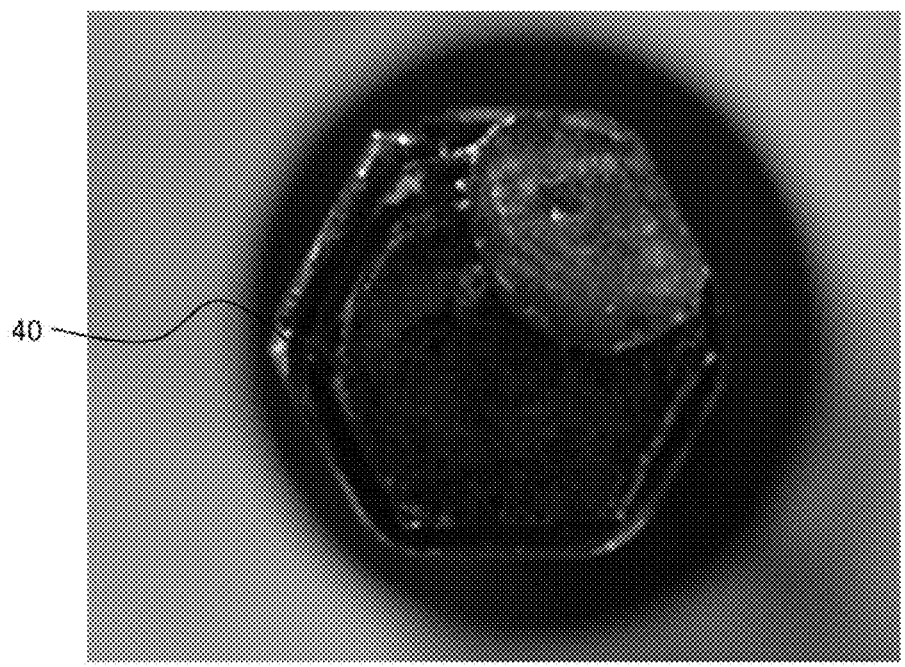
FIG. 7 is an external photograph of a SiC single crystal grown from a seed crystal substrate in the example, as viewed from the growth surface.

FIG. 6 is an external photograph of a SiC single crystal grown from the seed crystal substrate 14 as the origin, as viewed from the side. The grown crystal was a SiC single crystal, and no polycrystals were observed. FIG. 7 shows an external photograph of the grown crystal observed from the growth surface. No polycrystals were seen on the growth surface of the grown crystal, and a SiC single crystal was obtained. Extraneous material observed on the upper part of the growth surface was solidified Si—C solution adhering when the grown crystal was raised up from the Si—C solution.

Example 2

As in the growth step of Example 1, a seed crystal substrate 14 was contacted with a Si—C solution 24 at 1700° C. wherein the temperature gradient falling from the interior toward the surface was 25° C./cm, only the bottom face of the seed crystal substrate 14 was wetted with the Si—C solution 24, and the seed crystal substrate 14 was then raised so that the bottom face of the seed crystal substrate 14 was positioned 1.5 mm above the liquid surface of the Si—C solution 24, forming a meniscus in the Si—C solution.

Next, while changing the position of the seed crystal holding shaft so that the bottom face of the seed crystal substrate 14 was 1.5 mm above the liquid surface of the Si—C solution 24, based on the graph shown in FIG. 1, the temperature of the surface of the Si—C solution 24 was raised from 1700° C. to 2000° C. over 30 minutes for meltback, with a temperature gradient falling from the interior toward the surface of 25° C./cm, and the temperature and the temperature gradient were maintained for 5 hours to grow a SiC crystal. In this example, a SiC single crystal with no polycrystals was obtained, as in Example 1.

Comparative Example 1

As in the growth step of Example 2, a seed crystal substrate 14 was contacted with a Si—C solution 24 at 1700° C. wherein the temperature gradient falling from the interior toward the surface was 25° C./cm, only the bottom face of the seed crystal substrate 14 was wetted with the Si—C solution 24, and the seed crystal substrate 14 was then raised so that the bottom face of the seed crystal substrate 14 was positioned 1.5 mm above the liquid surface of the Si—C solution 24, forming a meniscus in the Si—C solution.

Next, without moving the position of the seed crystal substrate 14, the temperature of the surface of the Si—C solution 24 was raised from 1700° C. to 2000° C. over 30 minutes, with a temperature gradient falling from the interior toward the surface of 25° C./cm, and the temperature and the temperature gradient were maintained for 5 hours to grow a SiC crystal.

Figure 8:
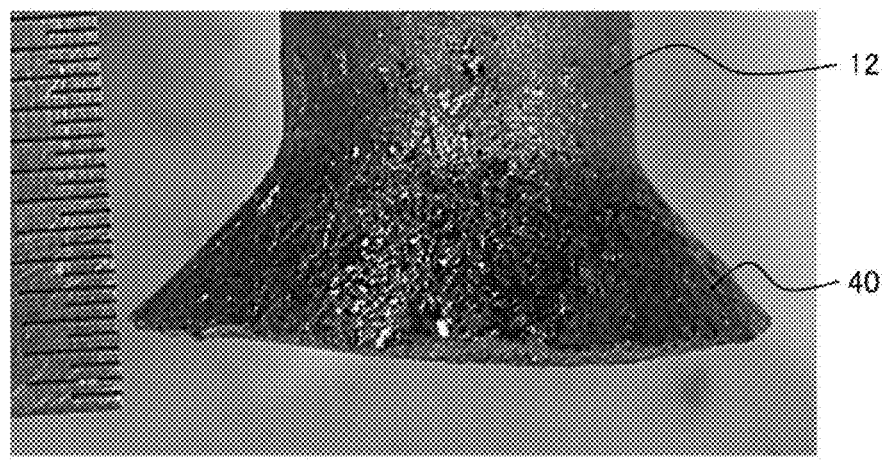
FIG. 8 is an external photograph of a SiC single crystal grown from a seed crystal substrate in the comparative example, as viewed from the side.
Figure 9:
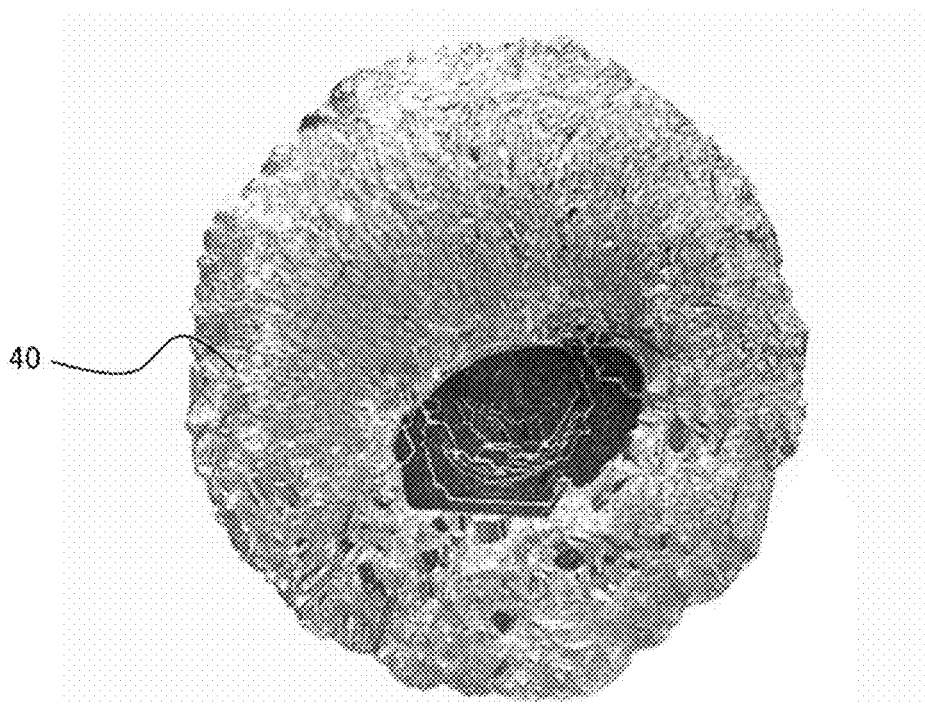
FIG. 9 is an external photograph of a SiC single crystal grown from a seed crystal substrate in the comparative example, as viewed from the growth surface.

FIG. 8 is an external photograph of a crystal grown from the seed crystal substrate 14 as the origin, as viewed from the side. The Si—C solution wetted up to the seed crystal holding shaft, and polycrystals were observed. FIG. 9 shows an external photograph of the grown crystal observed from the growth surface. Large amounts of solidified Si—C solution were adhering to the surface of the polycrystal-containing grown crystal.

Example 3

In this example, the single crystal production apparatus 200 shown in FIG. 4 was used. The single crystal production apparatus 200 comprises a graphite heater 38. In a graphite crucible 10 housing a Si—C solution 24 there was charged Si/Cr/Ni in an atomic compositional ratio of 55:40:5, as a molten liquid starting material. The air in the single crystal production apparatus was exchanged with argon. Graphite heaters 38A, 38B and 38C situated around the periphery of the graphite crucible 10 were electrified to melt the starting material in the graphite crucible 10 by heating, thereby forming a Si/Cr/Ni alloy molten liquid. A sufficient amount of C was then dissolved into the Si/Cr/Ni alloy molten liquid from the graphite crucible 10 to form a Si—C solution 24.

The outputs of the graphite heaters 38A, 38B and 38C were adjusted to heat the graphite crucible 10, forming a temperature gradient in which the temperature decreased from the interior of the Si—C solution 24 toward the surface of the solution. Formation of the prescribed temperature gradient was confirmed by using a vertically movable thermocouple to measure the temperature of the Si—C solution 24. The outputs of the graphite heaters 38A, 38B and 38C were controlled to adjust the temperature at the surface of the Si—C solution 24 to 1545° C. With the surface of the Si—C solution as the low-temperature side, the temperature difference was 10° C. between the temperature at the surface of the Si—C solution and the temperature at a depth of 1 cm in the direction perpendicular to the surface of the Si—C solution 24 toward the interior of the solution.

Next, by controlling the outputs of the graphite heaters 38A, 38B and 38C, the temperature at the surface of the Si—C solution 24 was raised to 1855° C. while maintaining the temperature gradient, and the liquid surface position of the Si—C solution between 1545° C. and 1855° C. was measured. The measurement results are shown in FIG. 3. The graph in FIG. 3 shows the liquid surface height of the Si—C solution between 1545° C. and 1855° C., with respect to zero as the liquid surface height of the Si—C solution at 1699° C. It was found that a higher Si—C solution temperature resulted in a greater liquid surface height of the Si—C solution in the range of 1545° C. to 1699° C., and a lower liquid surface height of the Si—C solution in the range of 1699° C. to 1855° C.

A cylindrical graphite seed crystal holding shaft 12 was prepared having a diameter of 12 mm and a length of 200 mm, and an end face with the same shape as the top face of the seed crystal substrate. There was prepared a truncated conic 4H—SiC single crystal with a (000-1) just face, having a thickness of 0.5 mm, a bottom face diameter of 12 mm and a top face diameter of 10 mm, formed by a sublimation process, for use as a seed crystal substrate 14.

The top face of the seed crystal substrate 14 was bonded to about the center section of the end face of the seed crystal holding shaft 12 by using a graphite adhesive, with the bottom face of the seed crystal substrate 14 as the (000-1) face.

Crystal Growth Step

In the same manner as the preparation step described above, the single crystal production apparatus 200 shown in FIG. 4 was used to form a Si—C solution 24, wherein the surface temperature was 1600° C. and the temperature gradient in which the temperature fell from the interior toward the surface was 10° C./cm.

The seed crystal holding shaft 12 holding the seed crystal substrate 14 was lowered, the seed crystal substrate 14 was contacted with the Si—C solution 24 so that the bottom face of the seed crystal substrate 14 matched the surface location of the Si—C solution 24, and only the bottom face of the seed crystal substrate 14 was wetted with the Si—C solution 24. The seed crystal substrate 14 was then raised so that the bottom face of the seed crystal substrate 14 was positioned 1.5 mm above the liquid surface of the Si—C solution 24, forming a meniscus in the Si—C solution.

Next, while changing the position of the seed crystal holding shaft so that the bottom face of the seed crystal substrate 14 was 1.5 mm above the liquid surface of the Si—C solution 24, based on the graph shown in FIG. 3, the temperature of the surface of the Si—C solution 24 was raised from 1600° C. to 1850° C. over 30 minutes for meltback, with a temperature gradient falling from the interior toward the surface of 10° C./cm, and the temperature and the temperature gradient were maintained for 5 hours to grow a SiC crystal. In this example, a SiC single crystal with no polycrystals was obtained, as in Example 1.

Comparative Example 2

As in the growth step of Example 2, a seed crystal substrate 14 was contacted with a Si—C solution 24 at 1600° C., wetting only the bottom face of the seed crystal substrate 14 with the Si—C solution 24, after which the seed crystal substrate 14 was raised so that the bottom face of the seed crystal substrate 14 was positioned 2.0 mm above the liquid surface of the Si—C solution 24, forming a meniscus in the Si—C solution.

The temperature of the surface of the Si—C solution 24 was then raised from 1600° C. to 1850° C. over 30 minutes, with a temperature gradient falling from the interior toward the surface of 10° C./cm, and the temperature and the temperature gradient were maintained for 5 hours to grow a SiC crystal.

When the crystal grown from the seed crystal substrate 14 as the origin was observed from the side, the Si—C solution wetted up to the seed crystal holding shaft, and polycrystals were seen.

EXPLANATION OF SYMBOLS

100 Single crystal production apparatus
200 Single crystal production apparatus
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
28 Opening at top of crucible
34 Meniscus
38 Graphite heater
38A Upper level graphite heater
38B Mid-level graphite heater
38C Lower level graphite heater
40 SiC grown crystal

What is claimed is:

1. A method for producing a SiC single crystal wherein a SiC seed crystal substrate held on a seed crystal holding shaft is contacted with a Si—C solution having a temperature gradient in which the temperature decreases from the interior toward the surface, to grow a SiC single crystal, the method for producing a SiC single crystal comprising the steps of:
    before step (A), measuring the liquid surface height of the Si—C solution as the temperature of the Si—C solution is changed from a first temperature to a second temperature,
    (A) bringing the temperature of the Si—C solution to the first temperature,
    (B) contacting the seed crystal substrate held on the seed crystal holding shaft with the Si—C solution,
    (C) bringing the temperature of the Si—C solution to the second temperature after the contacting the seed crystal substrate with the Si—C solution, and
    (D) moving the seed crystal substrate held on the seed crystal holding shaft in the vertical direction according to the change in liquid surface height of the Si—C solution that has been determined before step (A) when the temperature of the Si—C solution is brought from the first temperature to the second temperature, wherein
    the first temperature is lower than the second temperature, and
    the temperature difference between the first temperature and the second temperature is at least 100° C.

2. The method according to claim 1, wherein step (C) includes performing meltback of the seed crystal substrate.

3. The method according to claim 1, wherein the SiC single crystal is grown at the second temperature.

4. The method according to claim 2, wherein the SiC single crystal is grown at the second temperature.

5. The method according to claim 3, wherein the method comprises growing the SiC single crystal while forming a meniscus.

6. The method according to claim 4, wherein the method comprises growing the SiC single crystal while forming a meniscus.

7. The method according to claim 2, wherein the temperature is raised from the first temperature to the second temperature at a temperature-elevating rate of from 1° C./min to 20° C./min.

8. The method according to claim 2, wherein the temperature is raised from the first temperature to the second temperature at a temperature-elevating rate of from 3° C./min to 15° C./min.

* * * * *

UNITED STATES PATENT AND TRADEMARK OFFICE
CERTIFICATE OF CORRECTION

PATENT NO. : 9,982,365 B2
APPLICATION NO. : 14/541740
DATED : May 29, 2018
INVENTOR(S) : Katsunori Danno et al.

It is certified that error appears in the above-identified patent and that said Letters Patent is hereby corrected as shown below:

On the Title Page

Please correct items (71) and (73) to reflect the following:
TOYOTA JIDOSHA KABUSHIKI KAISHA, Toyota-shi, Aichi-ken (JP)

Signed and Sealed this
Sixteenth Day of October, 2018

Andrei Iancu
*Director of the United States Patent and Trademark Office*